United States Patent [19]
Li et al.

[11] Patent Number: 5,960,014
[45] Date of Patent: Sep. 28, 1999

[54] THIN FILM RESISTOR FOR OPTOELECTRONIC INTEGRATED CIRCUITS

[75] Inventors: Guo Ping Li; Agnes Margittai, both of Ottawa; Trevor Jones, Ontario; Joannie Marks, Ottawa; Frank R. Shepherd, Kanata, all of Canada

[73] Assignee: Northern Telecom Limited, Montreal, Canada

[21] Appl. No.: 08/977,371

[22] Filed: Nov. 24, 1997

Related U.S. Application Data

[62] Division of application No. 08/589,505, Jan. 22, 1996, abandoned.

[51] Int. Cl.[6] .................................................. H01S 3/20
[52] U.S. Cl. ............................. 372/20; 372/45; 372/43; 372/34
[58] Field of Search ................................. 372/20, 45, 43, 372/34

[56] References Cited

U.S. PATENT DOCUMENTS 5,173,909  12/1992  Sakano et al. .......................... 372/20
5,536,085   7/1996  Li et al. ................................. 372/20

*Primary Examiner*—Leon Scott, Jr.
*Attorney, Agent, or Firm*—Angela C. de Wilton

[57] ABSTRACT

A thin film resistor for optoelectronic integrated circuits is described. A stable low resistance, thin film resistor comprising a bilayer of platinum on titanium is provided. Advantageously, the resistive layer is protected by a layer of dielectric, e.g. silicon dioxide or silicon nitride to reduce degradation from humidity an under high temperature operation at 300° C. or more. The resistor may be formed on various substrates, including silicon dioxide, silicon nitride and semiconductor substrates. Applications for optoelectronic integrated circuits include integrated resistive heaters for wavelength fine tuning of a semiconductor laser array.

8 Claims, 5 Drawing Sheets

THIN FILM RESISTOR FOR OPTOELECTRONIC INTEGRATED CIRCUITS

This is a division of patent application Ser. No. 08/589,505 filed on Jan. 22, 1996, now abandoned, by G. P. LI, et al for "Thin Film Resistor for Optoelectronic Integrated Circuits".

FIELD OF INVENTION

This invention relates to a thin film resistor for an optoelectronic integrated circuit, with particular application as a resistive heater for thermally tuning a semiconductor laser array.

BACKGROUND OF THE INVENTION

As described in copending patent application Ser. No. 08/413,555 filed Mar. 30, 1995 to Guo Ping Li et al., entitled "Multi-wavelength gain coupled distributed feedback laser array with fine tunability", semiconductor lasers fabricated from group III–V alloys, can be tailored to emit radiation in the wavelength range from 1250 nm to 1600 nm for wavelength division multiplexing (WDM) communications technology.

While it is known to select discrete laser devices having a specific wavelength and to assemble hybrid arrays of such devices, pre-selection to locate lasers of specific wavelengths, and subsequent assembly and packaging are time consuming and costly. Reliability issues may give rise to variable performance with aging.

It has been proposed to thermally tune the central wavelength of individual semiconductor lasers by using integrated heater, as described for example, by L. A. Wang et al. in "Integrated four wavelength DFB laser array with 10 Gb/s speed and 5 nm continuous tuning range" in I.E.E.E Photonics Technology Letters 4(4) pp. 318–320 (1992) and by Sakano et al in "Tunable DFB laser with a striped thin film heater" in I.E.E.E Photonics Technology Letters 4(4) pp. 321–323 (1992) and in U.S. Pat. No. 5,173,909 issued Dec. 22, 1992, entitled "Wavelength Tunable Diode Laser". These references describe how tuning of 4 or 5 nm can be achieved by monolithically integrated heaters, i.e. resistors, to provide a laser array with multi-wavelength capability. Heating may induce band gap shrinking in semiconductors and change the crystal refractive index. Nevertheless, an extended range of tuning is required to provide a useful array with multi-wavelength capability, as explained by Guo Ping Li et al. in the above mentioned reference. Moreover, precise temperature control is required to prevent overheating, which may cause power reduction and reduce quantum efficiency.

Existing thin film resistors used as resistive heaters for tunable laser arrays are typically formed from a resistive layer of Ti with Au/Pt/Ti contact pads. These resistors are often insufficiently reliable, and sensitive to atmospheric humidity. Application of thermal fine tuning of laser diode arrays using Ti thin film resistors is not sufficiently reliable for practical applications.

Other resistance layers commonly used are NiCr, or Pd. Difficulties have been encountered in obtaining a satisfactory combination of low resistance, good controllability, and stability with known thin film resistors fabricated from these materials.

SUMMARY OF THE INVENTION

Thus the present invention seeks to provide an improved thin film resistor for an optoelectronic integrated circuit, having particular application as a resistive heater for a semiconductor laser array.

Thus according to one aspect of the invention there is provided a thin film resistor for an optoelectronic integrated circuit comprising a resistive portion and contact portions, the resistive portion comprising a bilayer of platinum on titanium.

The contact portions of the resistor preferably comprises low resistivity metallization, for example, a Ti/Pt/Au trilayer. The titanium/platinum resistive bilayer was found to provide improved stability and reliability relative to known thin film resistor structures.

Advantageously, the thin film resistor is encapsulated with a layer of dielectric, for example, silicon dioxide. The latter improves reliability by reducing the effects of atmospheric humidity, and contamination, and provides for stable operation at higher temperature e.g. at ~300° C.

According to another aspect of the present invention there is provided a laser diode array having a resistive heater for thermally tuning an output wavelength of the laser diode array, the resistive heater comprising a resistor having a resistive portion and contact portions wherein the resistive portion is provided by a bilayer of titanium and platinum.

The resistor structure was found to produce a stable and reliable resistive heater for wavelength fine tuning of a laser diode laser array, over a wavelength range of a few nm. Encapsulation of the resistor with a protective layer of dielectric, e.g. silicon dioxide improved stability of the resistor with respect to atmospheric humidity and contamination.

Advantageously, the resistor is formed with a layer of approximately 50 Å to 250 Å titanium and a layer of between 1000 Å and 5000 Å of platinum, depending on the required resistance value. For example, respective thicknesses of 250 Å titanium and 2000 Å platinum, provided a resistor of approximately 30 Ω resistance.

BRIEF DESCRIPTION THE DRAWINGS

Embodiments of the invention will now be described by way of example, with reference to the accompanying drawings, in which.

Figure 6:
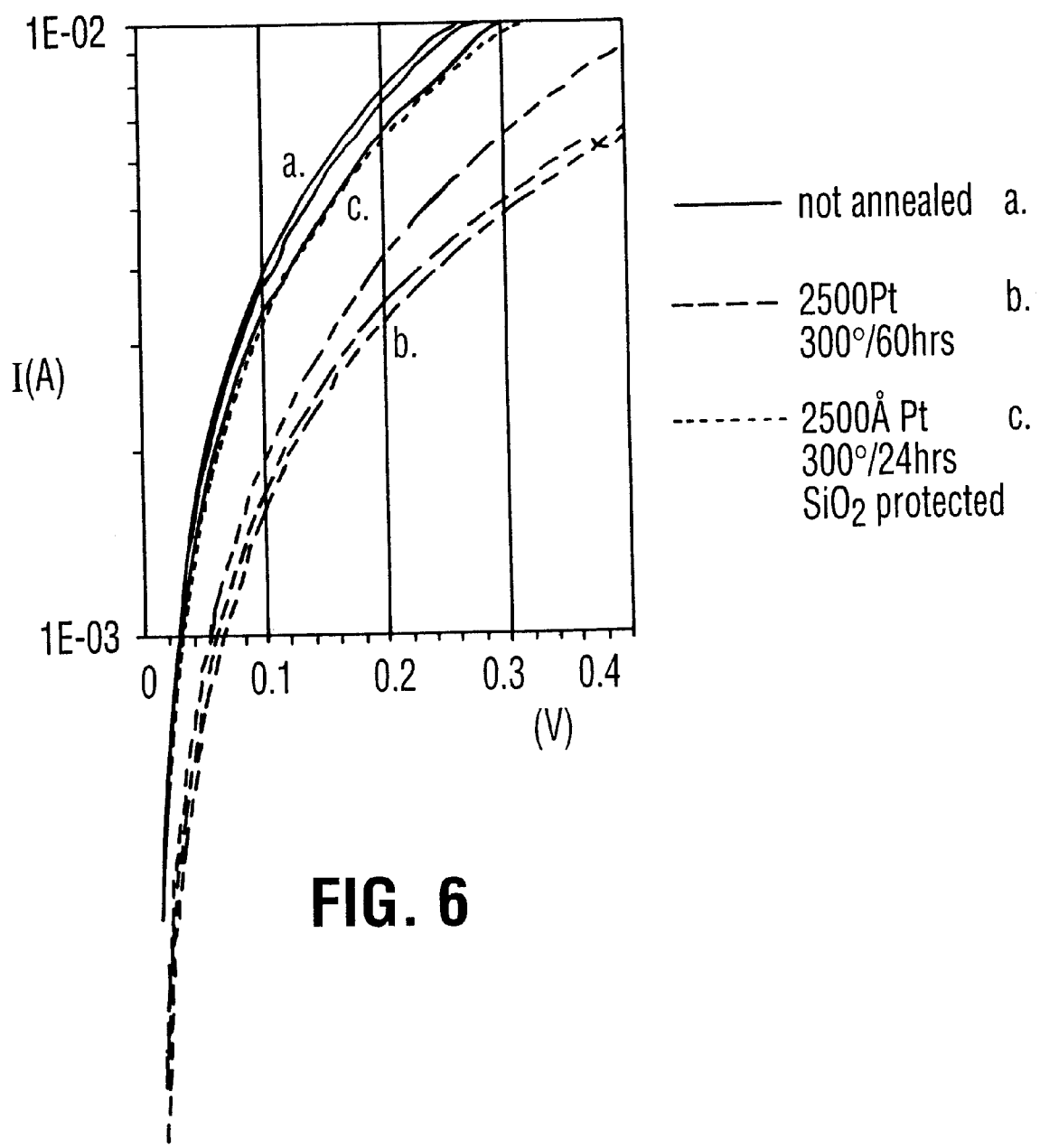
Figure 7:
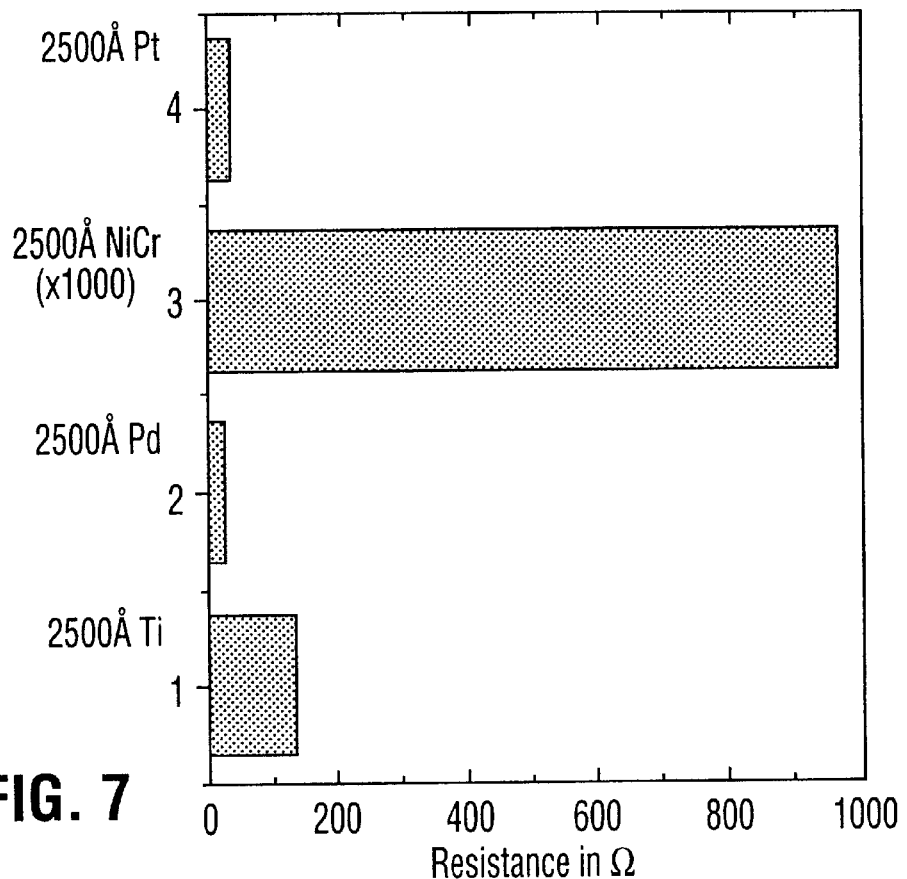
Figure 8:
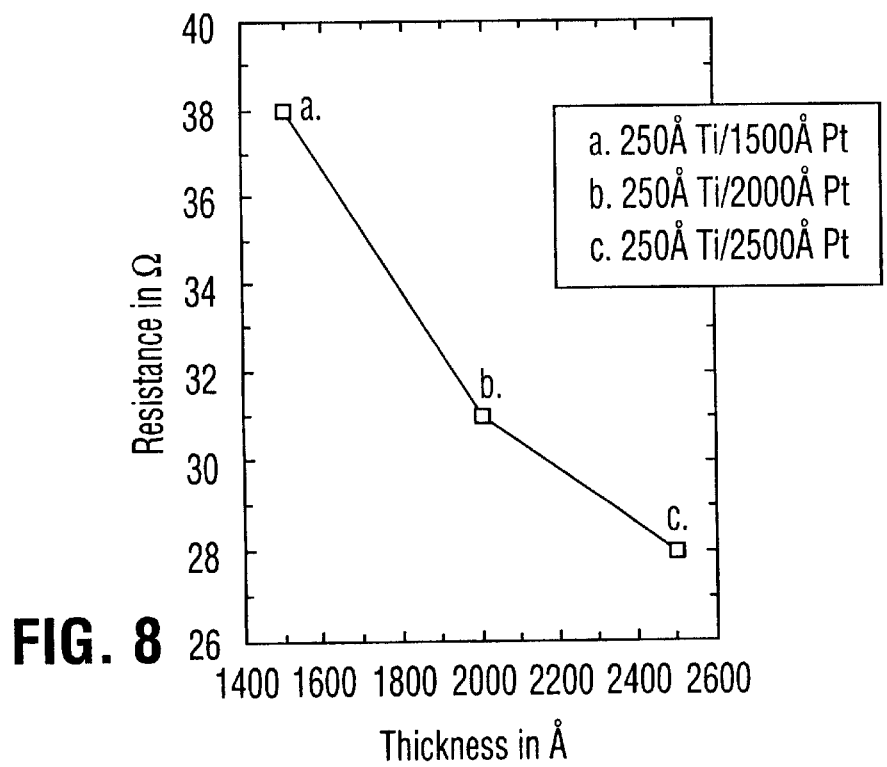
Figure 9:
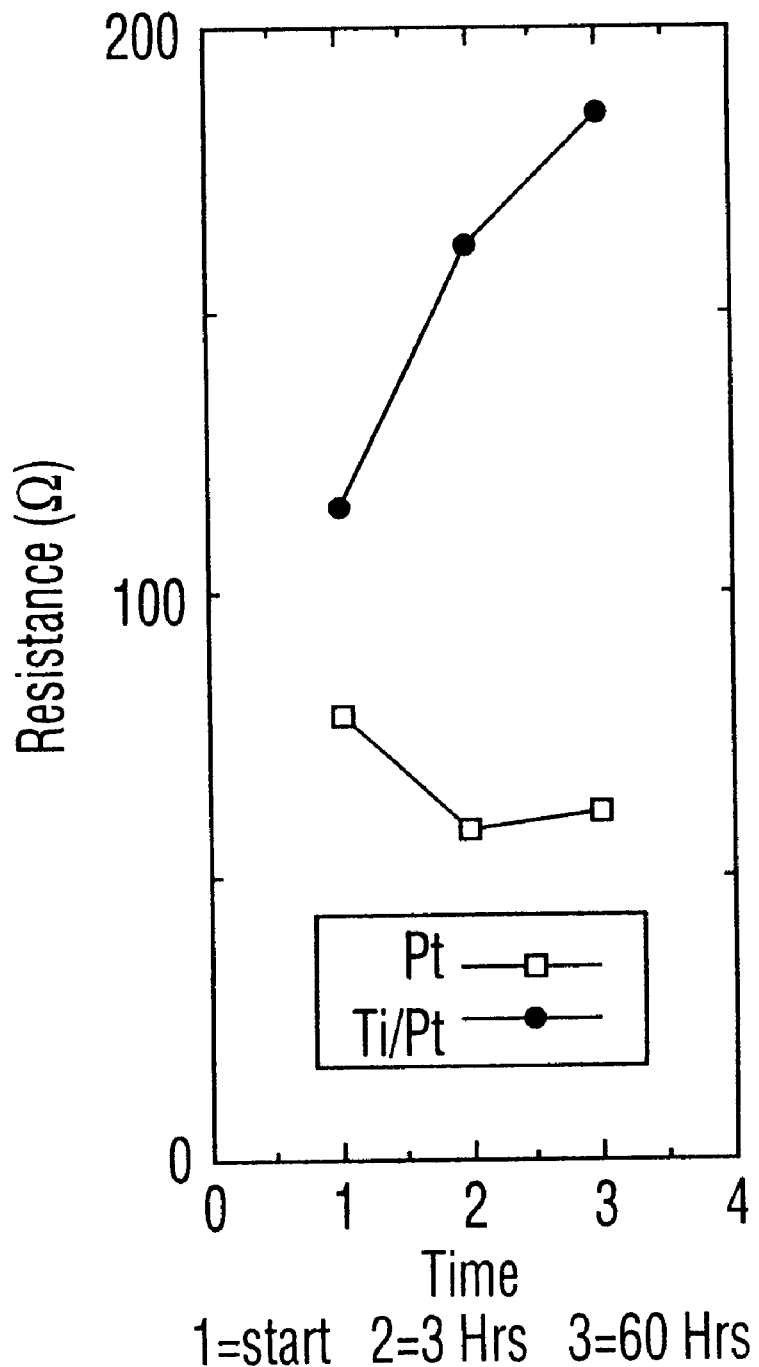

FIG. 6 compares the I–V curves for Pt/Ti resistors of the embodiment fabricated (250 Å Ti/2500 Å Pt), as a function of annealing, and with and without encapsulation;

FIG. 7 compares the resistance of conventional resistors fabricated from four different metals;

FIG. 8 shows the resistance in ohms vs. the thickness of platinum for Pt/Ti resistors fabricated according to the embodiment, with three different thicknesses of Pt;

FIG. 9 compares the resistance as a function of heating and aging, for a Pt/Ti bilayer resistor of the embodiment (250 Å Ti/2500 Å Pt), and a conventional Pt resistor.

DESCRIPTION OF THE PREFERRED EMBODIMENTS

Figure 1:
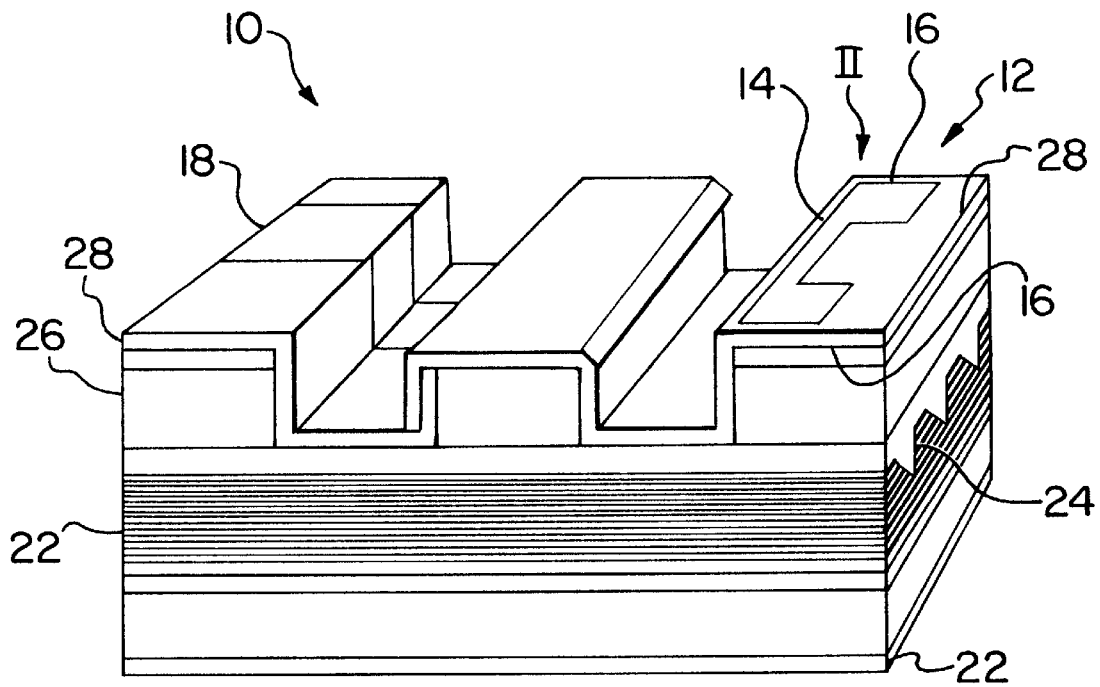
FIG. 1 shows a schematic diagram of part of an optoelectronic circuit comprising a gain coupled distributed feedback (DFB) laser diode having an integrated heater comprising a thin film resistor structure according to a first embodiment of the present invention.

Part of an optoelectronic circuit comprising a gain DFB laser 10 comprising an integrated heater in the form of a thin film resistor 12 according to a first embodiment of the present invention is shown in FIG. 1. The thin film resistor 12 comprises a resistive portion 14 and contact portions 16. The resistive portion 14 comprises a bilayer of a layer of titanium and an overlying layer of platinum. Preferably, the titanium layer is about 50 Å to 250 Å thick, and the platinum layer is about 1000 Å to 5000 Å thick. Contact regions 16 are formed by deposition of a layer of gold, to provide a low resistance tri-layer comprising Ti/Pt/Au. The resistor overlies the semiconductor laser formed in the substrate having top p electrode 18 and bottom n electrode 20, and comprising active region 22 including a multiquantum well structure and in which is defined a grating structure 24. Ridge structures 26 are formed in a conventional manner and an overlying dielectric layer of silicon dioxide 28 is provided thereon. Thus the resistor 12 is isolated from the underlying DEB laser structure by the dielectric layer 28. The resistor provides for heating of the laser structure to allow for thermal tuning of the output wavelength of the laser.

Figure 2:
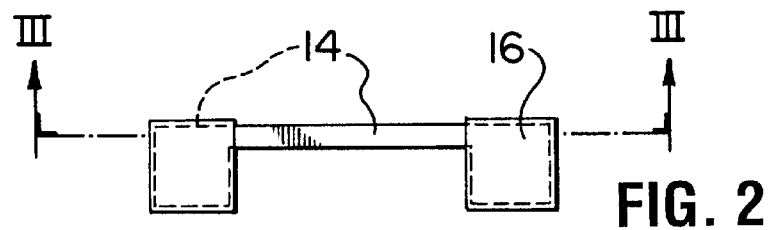
FIG. 2 shows a top plan view of the resistor of structure of the embodiment.
Figure 3:
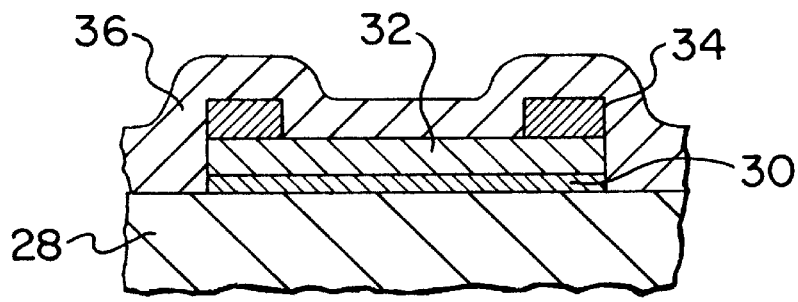
FIG. 3 shows a cross-sectional view of the resistor structure of the embodiment through section III—III of FIG. 2.
Figure 4:
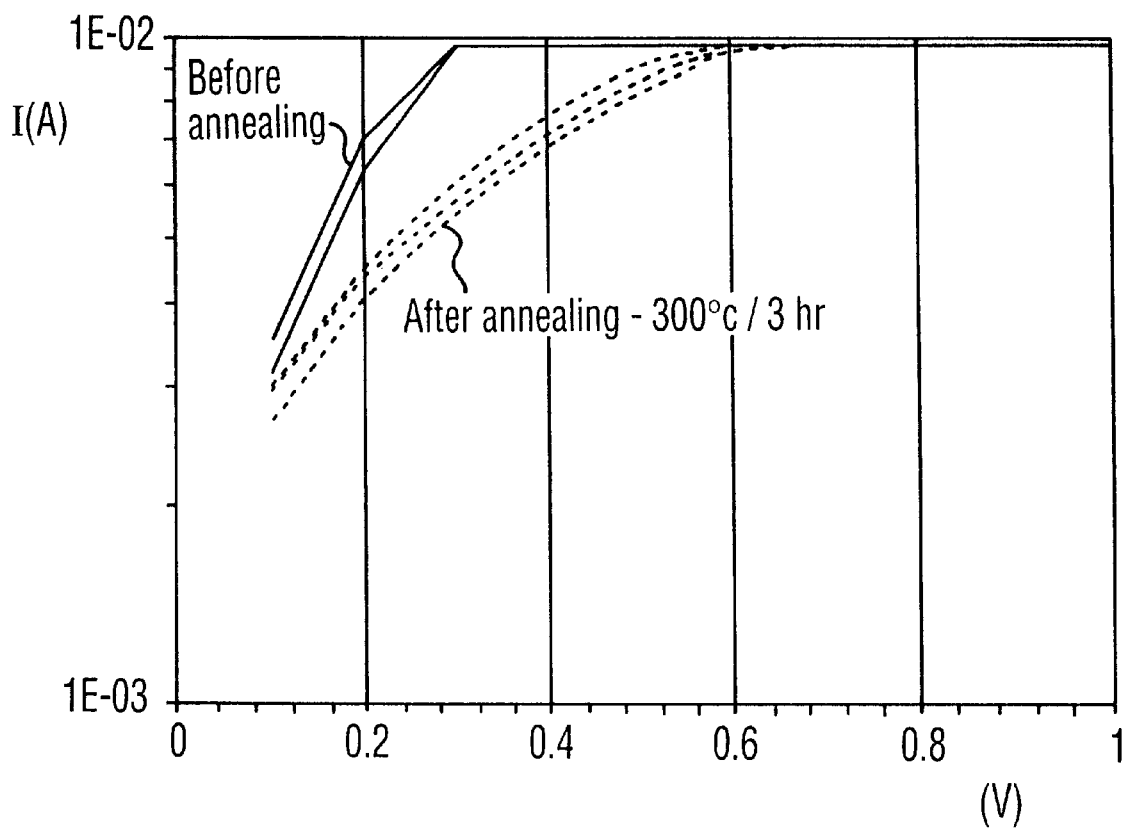
FIG. 4 shows current voltage (I–V) curves for a resistor structure according to the first embodiment having a resistive bilayer comprising 250 Å Ti and 2500 Å Pt, as deposited (solid lines) and after heat treatment at 300° C. for 3 hours (dashed lines).
Figure 5:
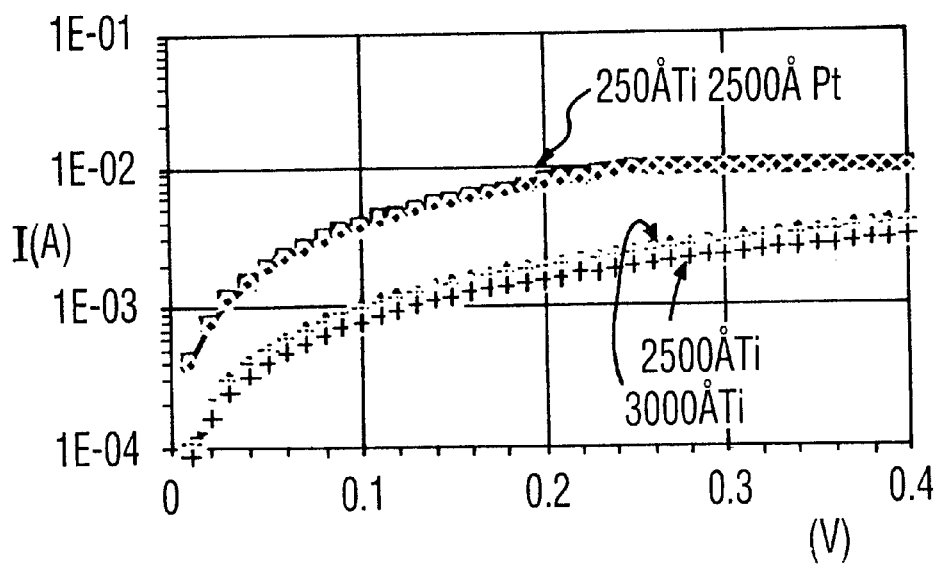
FIG. 5 shows I–V curves comparing results for Pt/Ti resistors of the embodiment fabricated with 250 Å Ti and 2500 Å Pt, with conventional Ti resistors of 2500 Å Ti and 3000 Å Ti, after heat treatment for 3 hours at 300° C. exposed to air.

A top plan view of the resistor 12 in the direction of arrow II in FIG. 1 is shown in FIG. 2. A corresponding cross-sectional view in the direction of arrows III—III of FIGS. 2 is shown in FIG. 3.

In a method of forming the thin film resistor 12 according to the embodiment of the present invention, after depositing the dielectric layer 28 overlying the laser structure 10, e.g. 3000 Å silicon dioxide, the substrate was coated with photoresist and patterned to define the resistor, the resulting photomask defining the narrow resistive portion 14 and wide contact portions 16 at each end of the resistive portion. A resistive bi-layer comprising a layer 30 of about 50 Å–250 Å of titanium and a layer 32 of a selected thickness of Pt was then deposited. Samples were fabricated for thicknesses of Pt in the range from 1000 Å to 5000 Å. Excess metal was removed by a known lift-off process. Then, the structure was coated with photoresist and patterned to expose contact regions 16 only, and a layer of gold 34 was deposited to provide contact regions comprising a Ti/Pt/Au trilayer at each end of the bilayer resistive portion 14. Excess metal was removed by a lift-off technique. Selected resistors were then coated with a protective layer 36 of dielectric comprising silicon dioxide.

For comparison with the bilayer resistor of the embodiment, similar sets of devices were fabricated with different resistive layers, i.e. single layers of 2500 Å and 3000 Å layers of Ti, and single layers of 3000 Å NiCr, which are conventionally used for thin film resistors.

The resulting resistors were characterized by conventional methods to assess the resistance characteristics as a function of aging at elevated temperatures. Following deposition, current voltage curves were recorded to obtain resistance measurements, and then re-measured after heat treatment at 300° C. for up to 60 hours to assess stability of the resulting heater resistors. Results are summarized in Table 1 below.

For a resistors comprising a bilayer of 250 Å Ti and 2500 Å Pt, as shown in FIG. 2, the resistance of the as-deposited resistor was 30 Ω. Aging at 300° C. for 3 hours resulted in a 20% increase in resistance to 36 Ω, and a further increase to 48 Ω, after aging at 300° C. for 60 hours. By comparison, aging at 300° C. for 60 hours of resistors having a protective layer of silicon dioxide, resulted in no significant change in resistivity from the as deposited value (see Table 1). The resistance was dependent on the thickness of the Pt layer, i.e. the resistance diminished as the thickness of Pt was increased, from about 38 ohms for 1400 Å Pt on 250 Å Ti, to 28 ohms for 2500 Å Pt, on 250 Å Ti (FIG. 8).

For comparison, resistors were also formed by a conventional method using a single layer of Pt, Ti, NiCr or Pd. It was observed that the resistors fabricated with 250 Å Ti and a selected thickness of Pt showed improved stability over the resistors fabricated using Ti alone, NiCr, or Pd. The resistance of Ti resistors increased significantly from 120 to 190 ohms after heating for 3 hrs at 300° C. Resistors formed from a single layer of 3000 Å of Ti had resistances of 106 Ω as deposited, and 135 Ω after again for 60 hours at 300° C. Resistors fabricated with a single layer of 2500 Å Pt diminished in resistivity from 78 to 58 ohms after heat treatment for 3 hours at 300° C. NiCr resistors showed much higher resistivities kΩ (see FIG. 7).

A further marked improvement in stability of the Ti/Pt resistors of the embodiment was observed when the resistors were coated with a dielectric passivating layer of silicon dioxide (see FIG. 6). In the latter experiment, aging for 3 hrs at 300° C. caused a 20% increase in resistivity to 36 from 30 ohms as deposited; aging for 60 hrs at 300° C. resulted in 60% increase in resistivity to 48 ohms significant further change. On the other hand after coating with silicon dioxide, and aging for 60 hrs at 300° C., the resistivity was not significantly different from the as-deposited value.

For comparison a 3000 Å layer of Pt alone increased in resistivity from 106 ohms to 135 ohms after aging. While a single layer of Pd also provided low resistance value of about 20 ohms, some peeling of the Pd layer was observed, reducing reliability.

Deposition of layers at Ti at a lower rate, e.g. 5–6 Å/sec, provided improved adhesion on the substrate relative to films deposited at 10–12 or 20–30 Å/second. There was no detectable cracking or peeling at the lower deposition rate; some cracking and peeling was observed for higher deposition rates.

The Pt/Ti bilayer resistors may be fabricated on silicon dioxide, silicon nitride and semiconductor substrates with good adhesion. These resistors provide stable low resistances, which can be operated at high temperature, ~300° C. With a dielectric protective layer encapsulating the resistor, stability to atmospheric humidity is much improved.

Thus improved stability of the Pt/Ti bilayer resistor provides for reliable fine tuning of laser diode arrays, which was not possible with known single metal layer resistors.

TABLE I

| Bilayer Resistor layer 1/layer 2 | | Comments | Encapsulation | As deposited | 3 hr 300° C. | 60 hr 300° C. | 300 hr 300° C. |
|---|---|---|---|---|---|---|---|
| 250Å Ti | 2500Å Pt | | none | 30Ω | 36Ω | 48Ω | |
| 250Å Ti | 2500Å Pt | | SiO₂ | 30Ω | | 31Ω | |
| 250Å Ti | 1500Å Pt | | | 38Ω | | | |
| 250Å Ti | 2000Å Pt | | | 31Ω | | | |
| 250Å Ti | 3000Å Pt | | | 28Ω | | | |
| Single layer resistor | | | | | | | |
| 2500Å Pt | | | | 78Ω | 58Ω | | 61Ω |
| 2500Å Ti | | | | 115Ω | 162Ω | | 185Ω |
| 2500Å Pd | | peeling | | 21Ω | | | |
| 3000Å NiCr | | | | 958 kΩ | | | |

What is claimed is:

1. A laser diode array having a resistive heater for thermally fine tuning an output wavelength of the laser diode array, the resistive heater comprising a thin film resistor comprising a resistive portion and contact portions, the resistive portion comprising a metal bilayer of first layer of titanium and an overlying layer of platinum.

2. A laser diode array according to claim 1 wherein the thin film resistor comprises an overlying encapsulating dielectric layer.

3. A laser diode array according to claim 2 wherein the dielectric layer comprises silicon dioxide.

4. A laser diode array according to claim 2 wherein the dielectric layer comprises silicon nitride.

5. A laser diode array according to claim 2 wherein the titanium layer has a thickness from 50 Å to 250 Å, and the platinum layer has a thickness from 1000 Å to 5000 Å.

6. A laser diode array according to claim 1 wherein the first layer of titanium comprising the resistive portion of the thin film resistor has a first thickness and the second layer of platinum has a second thickness greater than the first thickness.

7. A laser diode array according to claim 1 wherein the metal bilayer consists of a titanium layer having a thickness of 250 Å and a platinum layer having a thickness of 2000 Å.

8. A laser diode array according to claim 1 wherein the contact portions comprise a layer of gold to provide a low resistivity Ti/Pt/Au trilayer.

* * * * *